United States Patent [19]

Singh et al.

[11] Patent Number: 4,955,699

[45] Date of Patent: Sep. 11, 1990

[54] PRECIOUS METAL DOPED CRYSTALS FOR HARDENING OF THE CRYSTALS

[75] Inventors: Narsingh B. Singh, Murrysville; Tom Henningsen; Robert Mazelsky, both of Monroeville; Richard H. Hopkins, Murrysville; Milton S. Gottlieb, Churchill Boro, all of Pa.

[73] Assignee: Westinghouse Electric Corp., Pittsburgh, Pa.

[21] Appl. No.: 276,093

[22] Filed: Nov. 23, 1988

Related U.S. Application Data

[63] Continuation-in-part of Ser. No. 113,843, Oct. 28, 1987.

[51] Int. Cl.5 .......................... G02F 1/01; G02F 1/11; G02F 1/33
[52] U.S. Cl. ...................... 350/353; 350/355; 350/358
[58] Field of Search ............... 350/358, 353, 355; 252/584; 300/353, 355, 358

[56] References Cited

U.S. PATENT DOCUMENTS

| | | |
|---|---|---|
| 3,733,499 | 5/1973 | Deis et al. |
| 3,746,866 | 7/1973 | Feichtner et al. ............... 250/372 |
| 3,792,287 | 2/1974 | Roland et al. ............... 307/88.3 |
| 3,799,659 | 5/1974 | Roland et al. ............... 350/358 |
| 3,805,916 | 4/1974 | Milam ............... 182/139 |
| 3,915,556 | 10/1975 | Roland et al. ............... 350/358 |
| 3,928,814 | 12/1975 | Feichtner . |
| 3,929,970 | 12/1975 | Issaccs et al. ............... 423/299 |
| 3,994,569 | 11/1976 | Issaacs et al. . |
| 4,468,707 | 8/1984 | Kuehnle et al. ............... 358/300 |
| 4,577,098 | 3/1986 | Ogawa ............... 350/354 X |
| 4,825,061 | 4/1989 | Schoenbach et al. ............... 350/211 R |

OTHER PUBLICATIONS

An article by N. B. Singh et al. in *Materials Letters*, vol. 4, No. 1, Nov. 1985, entitled "Growth and Characteristics of AgTlSe Crystals".

An article by N. B. Singh et al. in the Journal, *Crystal Growth*, vol. 78 (1986), pp. 43–50, entitled "Etching Studies on Crystals of Thallium Arsenic Selenide".

An article by Robert F. Feigelson et al. in the Journal, *Crystal Growth*, vol. 49 (1980), pp. 399–402, entitled "Optical Imaging of Growth Defects and Infrared Crystals".

*Primary Examiner*—Eugene R. Laroche
*Assistant Examiner*—Michael B. Shingleton
*Attorney, Agent, or Firm*—Daniel P. Cillo

[57] ABSTRACT

Disclosed is a crystal 1 of thallium arsenic selenide, thallium arsenic sulfide, thallium vanadium sulfide, thallium phosphorous selenide, lead halide, cadmium sulfide, cadmium selenide, cadmium tin arsenide, cadmium germanium arsenide, indium phosphoride, indium arsenide, or mixtures thereof, doped with a precious metal in an amount of about 25 ppm up to the solubility limit of a precious metal in the crystal. The crystal is useful in nonlinear optical devices, acousto-optical devices, piezoelectric devices, and other types of optical and acoustic devices.

25 Claims, 3 Drawing Sheets

PRECIOUS METAL DOPED CRYSTALS FOR HARDENING OF THE CRYSTALS

CROSS-REFERENCE TO A RELATED APPLICATION

This application is a continuation-in-part of U.S. Ser. No. 113,843, filed Oct. 28, 1987, and entitled SILVER DOPED CRYSTALS.

TECHNICAL FIELD

The invention relates to precious metal doped crystals of for example, thallium arsenic selenide, thallium arsenic sulfide, thallium vanadium sulfide, thallium phosphorous selenide, lead halides, cadmium sulfide, cadmium selenide, cadmium tin arsenide, cadmium germanium arsenide, indium phosphoride, indium arsenide, and the like, and mixtures thereof.

BACKGROUND OF THE INVENTION

In U.S. Pat. No. 3,733,499 a crystal of thallium arsenic selenide, $Tl_3AsSe_3$, is described for use in a pyroelectric detector. While crystals of thallium arsenic selenide have excellent nonlinear optical properties, it is difficult to make quality crystals of the material because of its softness. During growth, crystals of thallium arsenic selenide can exhibit a variety of macroscopic defects including cracks, precipitates, inclusions, voids, striations, and compositional inhomogeneity depending upon the growth parameters employed. Lengthy and careful optical polishing and fabrication techniques are required to provide crystals that are free from significant flaws. Improvements in optical scattering losses and optical homogeneity are required before the full capabilities of this material can be realized in various optical devices.

The main object of this invention is to produce crystals of thallium arsenic selenide, thallium arsenic sulfide, thallium vanadium sulfide, thallium phosphorous selenide, lead halides, cadmium sulfide, cadmium selenide, cadmium tin arsenide, cadmium germanium arsenide, indium phosphoride, indium arsenide, and the like, and mixtures thereof, that have superior physical and optical properties and are easier to fabricate.

SUMMARY OF THE INVENTION

We have discovered that the quality of thallium arsenic selenide crystals and certain related crystals can be significantly improved by doping the crystals with precious metals or Group I B metals. The precious metals doped crystals are not only significantly harder, which reduces the time and care required for optical polishing and fabrication, but also exhibit improved optical efficiency, beam quality, damage threshold, and absorption characteristics.

DISCLOSURE OF THE INVENTION

The invention will become more apparent by reading the following detailed description in conjunction with the drawings, which are shown by way of example only, wherein.

Figure 1:
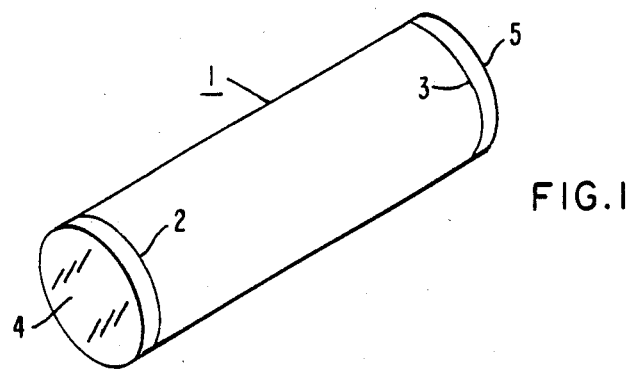
FIG. 1 is an diagrammatic view of a certain presently preferred embodiment of a nonlinear optical rod according to this invention.

In FIG. 1, rod 1 of a single crystal according to this invention, has polished faces 2 and 3 which are covered with antireflective coatings 4 and 5, respectively. This rod could be used in devices such as laser frequency converters, where light enters the crystal through one optical face and exits the crystal from the opposite optical face at a different frequency.

Figure 2:
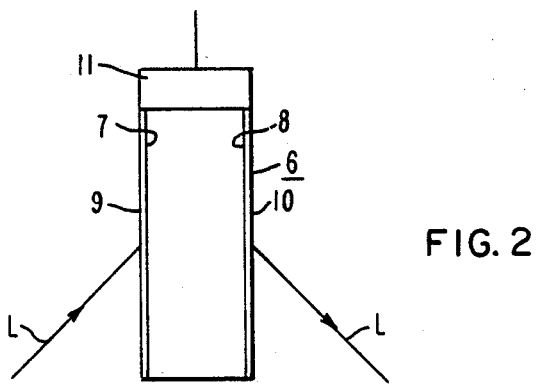
FIG. 2 is an diagrammatic view of a certain presently preferred embodiment of an acousto-optical tunable filter made from a crystal according to this invention.

In FIG. 2, rod 6 of a single crystal according to this invention, has optical faces 7 and 8 which are coated with antireflective coatings 9 and 10, respectively. Mounted to one side of rod 6 is transducer 11, which generates acoustic waves in the crystal that correspond in frequency to the frequency of the electricity impressed upon transducer 11. Light L enters one face of the crystal and exits the other face of the crystal modulated in some way by the acoustic waves, such as being diffracted, polarization rotated, or frequency shifted.

Figure 3:
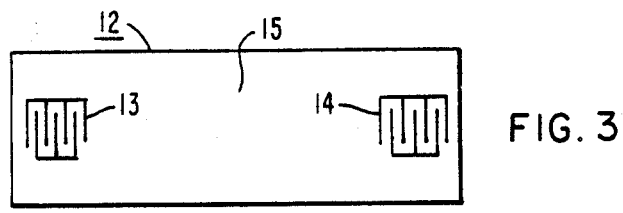
FIG. 3 is a plan view showing a certain presently preferred embodiment of an acoustic delay line employing a crystal according to this invention.

In FIG. 3, a rod 12 of a single crystal according to this invention, has sending transducer 13 and receiving transducer 14 mounted on polished surface 15. An electrical signal sent to transducer 13 produces surface acoustic waves in crystal 12 which travel to receiving transducer 14 where they are reconverted into an electrical signal.

The crystalline structures included within the scope of this invention are thallium arsenic selenide, a rhombohedral crystal having the formula $Tl_3AsSe_3$; thallium arsenic sulfide, an orthorhombic crystal having the formula $Tl_3AsS_4$; thallium vanadium sulfide, a cubic crystal having the formula Tl thallium phosphorous selenide, an orthorhombic crystal having the formula $Tl_3PSe_4$; lead halides, orthorhombic crystals having the formula $PbX_2$ where X is chlorine, bromine or iodine; cadmium sulfide, a hexagonal crystal having the formula CdS; cadmium selenide, a hexagonal crystal having the formula CdSe; cadmium tin arsenide, a tetragonal crystal having the formula $CdSnAs_2$; cadmium germanium arsenide, a tetragonal crystal having the formula $CdGeAs_2$; indium phosphide, a cubic crystal having the formula InP; indium arsenide, a cubic crystal having the formula InAs; and the like, and mixtures thereof. Thallium arsenic selenide is preferred as precious metal doping has been found to work very well with that crystal. In the precious metal doped crystals of this invention, precious metal replaces or occupies sites in the crystalline structure that would usually be occupied by the thallium in the crystalline structure. The amount of precious metal that can be used lies within the range of 25 ppm (parts per million, by weight) up to the solubility limit of the precious metal in the crystal, which is generally less than 800 ppm. If less than 25 ppm precious metal is used, there is little effect upon the properties of the crystal. The preferred amount of precious metal in the crystal is about 50 to about 300 ppm (or up to the solubility limit, whichever is lower) as that is a more optimal range.

The dopant is a precious metal, and more preferably a Group I B metal such as copper, silver, gold, and mixtures thereof.

The crystals can be made in a variety of ways known to those skilled in the art, but the preferred technique is the Bridgman method. In the Bridgman method, amounts of the solid elements in the proportions required to form a crystal are weighed out, melted together, and cooled to form a homogeneous multi-crystalline bar. The bar is placed a sealed quartz glass tube, the growth tube, that has a single crystal seed of the same crystal structure at the bottom. The bar is then melted while carefully avoiding melting the seed, and the bar is then very slowly solidified beginning with the portion that is next to the seed. This is called "directional freezing" and can be accomplished in a furnace by slowly lowering the growth tube down through the furnace or by raising the furnace up over the tube. The Bridgman technique is preferred to other methods of preparation because the melt is enclosed. Arsenic, sulfur, and selenium have significant vapor pressures at the melt temperatures, and, if the melt is not enclosed, the escape of these elements will alter the melt composition and may result in inclusions of a second phase in the crystal.

Crystals prepared according to this invention can be used in a variety of optical, acoustic, and acousto-optical devices, including optical spectrometers, nonlinear optical devices in the infrared such as laser frequency converters, optical parametric oscillators, mixers, and harmonic generators, acousto-optical devices such as tunable filters, dispersive light filters, and Bragg cells, and piezoelectric devices such as acoustic delay lines. The following examples further illustrate this invention.

EXAMPLE 1

The following compositions were prepared using solid metal elements.

| Element | Composition A (gm) | Composition B (gm) | Composition C (gm) |
|---|---|---|---|
| Thallium | 355.33 | 397.73 | 535.88 |
| Arsenic | 43.42 | 48.61 | 64.54 |
| Selenium | 137.23 | 153.67 | 207.00 |
| Silver | 0.95 | | |
| Copper | | | .16 |

The elements required to make each composition were placed in a quartz tube and were heated to 700° C. for 4.5 hours to form homogenous melts. The melts were cooled to room temperature to form bars 10 cm long and 2.5 cm in diameter. Each bar was placed in a quartz growth tube having a single crystal of thallium arsenic selenide at the bottom. Each bar was melted without melting the seed crystal. The growth tubes were placed in Bridgman furnaces and were lowered to cool the melt at a temperature gradient of 53° C./cm at a growth rate of 1 cm/day. Sections of the crystals 5 cm long were prepared and the faces were optically polished. During optical polishing it was noticed that the silver doped crystal was much more resistant to damage and was easier to polish.

Figure 4:
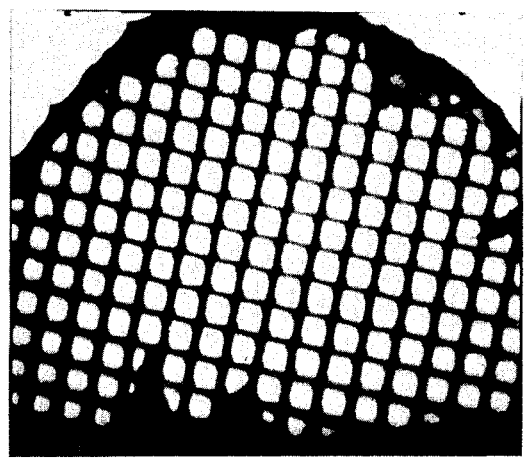
FIG. 4 is a photograph of a metallic grid seen through a crystal of thallium arsenic selenide.
Figure 5:
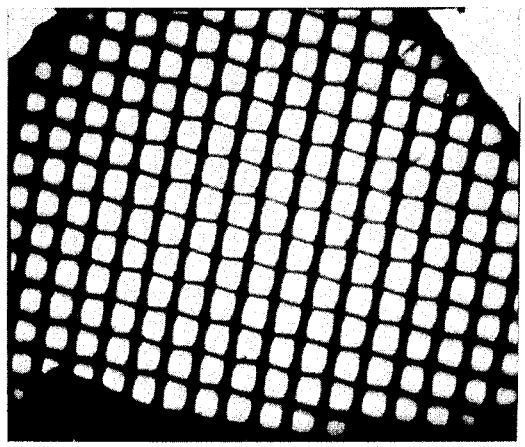
FIG. 5 is a photograph of a metallic grid seen through a crystal of silver doped thallium arsenic selenide.
Figure 6:
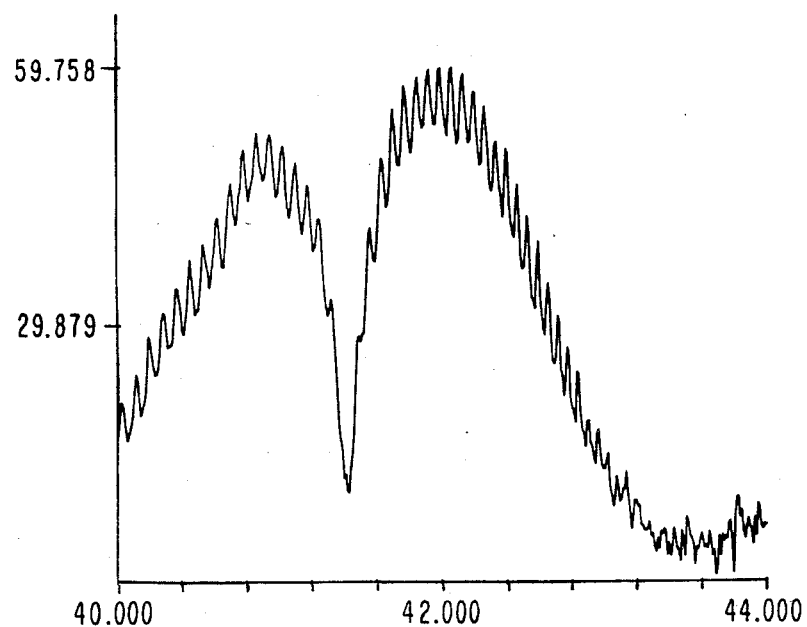
FIG. 6 is a photograph illustrating the resolution for a copper-doped thallium arsenic selenide crystal AOTF device.

A metal grid was placed at one end of each crystal and light that passed through the metal grid was observed from the other side of the crystal. FIGS. 4 and 5 show the results for single crystals made from Compositions A and B, respectively. The doped crystal was tested in a laser at a laser energy of 1 Joule/cm$^2$ and no bulk or surface damage was found. An etchpit analysis of the two crystals showed that, on a microscopic scale, the silver-doped crystal was more uniform. FIGS. 4 and 5 show that there were far fewer microcracks generated from the edges of the silver doped crystal than for the undoped crystal.

The copper-doped crystal showed excellent transparency and was virtually distortion-free. The copper-doped crystal (Composition C) did not show any significant change in optical or acoustic properties from the pure TAS (Composition B). An AOTF device using the copper-doped TAS was used to evaluate resolution. A resolution of two wave numbers was observed. FIG. 5 shows the experimental curve of the copper-doped TAS crystal. The copper-doped TAS crystal shows significantly less optical absorption loss and greater homogeneity when compared with a pure TAS crystal.

We claim:

1. A crystalline structure selected from the group consisting of thallium arsenic selenide, thallium arsenic sulfide, thallium vanadium sulfide, thallium phosphorous selenide, lead halide, and mixtures thereof, where said crystalline structure is doped by a precious metal selected from the group consisting of copper, silver, gold and mixtures thereof, in an amount of about 25 ppm by weight up to about 3 ppm by weight.

2. A crystalline structure according to claim 1 which is multicrystalline.

3. A single crystal according to claim 1.

4. A crystalline structure according to claim 1 wherein the amount of said precious metal is about 50 to about 300 ppm, and is selected from the group consisting of silver, gold, and mixtures thereof, to provide a hardened material.

5. A crystalline structure according to claim 1 wherein said precious metal is silver.

6. A crystalline structure according to claim 1 wherein said precious metal is gold.

7. A crystalline structure according to claim 1 wherein said crystalline structure is lead halide and the halide in said lead halide is selected from the group consisting of chlorine, bromine, and iodine.

8. A crystalline structure according to claim 1 wherein said crystal is thallium arsenic selenide.

9. A crystalline structure according to claim 1 wherein said crystal is thallium arsenic sulfide.

10. A crystalline structure according to claim 1 wherein said crystal is thallium vanadium sulfide.

11. A crystalline structure according to claim 1 wherein said crystal is thallium phosphorous selenide.

12. A crystalline structure according to claim 1 having polished opposing optical faces.

13. A crystalline structure according to claim 12 wherein said faces are coated with an antireflective coating.

14. A crystalline structure selected from the group consisting of thallium arsenic selenide, thallium arsenic sulfide, thallium vinadium sulfide, thallium phosphorous selenide, lead halide, cedmium sulfide, cadmium selenide, cadmium tin arsenide, cadmium germanium arsenide, indium phosphide, indium arsenide, and mixtures thereof, where said crystalline structure is doped by a precious metal in an amount of about 25 ppm by weight up to the solubility limit of said precious metal in the crystalline structure, and wherein sending and receiving transducers are mounted on one surface of said crystalline structure.

15. Single crystal consisting of thallium arsenic selenide doped with silver in an amount from about 25 ppm to about the solubility limit of silver in crystalline thallium arsenide selenide.

16. A crystal according to claim 15 when the amount of said silver is about 50 to about 300 ppm.

17. A crystal according to claim 15 in the form of a rod having opposing optically polished faces.

18. A single crystal, in the form of a rod, consisting of thallium arsenic selenide doped with silver in an amount from amount 25 ppm to about the solubility limit of silver in crystalline thallium arsenide selenide, where the rod has opposed optically polished faces, with a transducer mounted to the side of said rod.

19. A single crystal consisting of thallium arsenic selenide doped with silver in an amount from about 25 ppm to about the solubility limit of silver in crystalline thallium arsenide selenide, having a sending transducer and a receiving transducer mounted to the side of said crystal.

20. A single crystal consisting of thallium arsenic selenide doped with gold in an amount from about 25 ppm to about the solubility limit of gold in crystalline thallium arsenide selenide.

21. A crystal according to claim 20 when the amount of gold is about 50 to about 300 ppm.

22. A crystal according to claim 20 in the form of a rod having opposing optically polished faces.

23. A crystal according to claim 22 having a transducer mounted to the side of said rod.

24. A single crystal consisting of thallium arsenic selenide doped with copper in an amount from about 25 ppm to about the solubility limit of copper in crystalline thallium arsenide selenide, having a sending transducer and a receiving transducer mounted to the side of said crystal.

25. A crystalline structure selected from the group consisting of thallium arsenic selenide, thallium arsenic sulfide, thallium vanadium sulfide, thallium phosphorous selenide, lead halide, cadmium sulfide, cadmium selenide, cadmium tin arsenide, cadmium germanium arsenide, indium phosphide, indium arsenide, and mixtures thereof, where said crystalline structure is doped by a precious metal selected from the group consisting of copper, silver, gold, and mixtures thereof, in an amount of about 25 ppm by weight up to about 300 ppm by weight, to provide a hardened material.

* * * * *